United States Patent [19]

Takahashi

[11] Patent Number: 5,687,127
[45] Date of Patent: Nov. 11, 1997

[54] SENSE AMPLIFIER OF SEMICONDUCTOR MEMORY HAVING AN INCREASED READING SPEED

[75] Inventor: Hiroyuki Takahashi, Tokyo, Japan

[73] Assignee: NEC Corporation, Tokyo, Japan

[21] Appl. No.: 598,978

[22] Filed: Feb. 9, 1996

[30] Foreign Application Priority Data

Feb. 9, 1995 [JP] Japan ................................. 7-021462

[51] Int. Cl.$^6$ .............................................. G11C 7/00
[52] U.S. Cl. .................... 365/205; 365/207; 327/51; 327/52
[58] Field of Search ........................ 365/205, 207, 365/208; 327/51, 52

[56] References Cited

U.S. PATENT DOCUMENTS

| | | | |
|---|---|---|---|
| 5,297,080 | 3/1994 | Yamamoto | 365/205 X |
| 5,343,428 | 8/1994 | Pilo et al. | 365/205 X |
| 5,440,506 | 8/1995 | Longway et al. | 365/207 X |

OTHER PUBLICATIONS

N. Tamba et al., "A 1.5ns 256kb BiCMOS SRAM with 11k 60ps Logic Gates", 1993 IEEE International Solid–State Circuits Conference, pp. 246–247.

*Primary Examiner*—David C. Nelms
*Assistant Examiner*—Huan Hoang
*Attorney, Agent, or Firm*—Sughrue, Mion, Zinn, Macpeak & Seas

[57] ABSTRACT

A semiconductor memory includes one pair of signal lines, and a plurality of memory cells connected to the plurality of word lines, respectively, and also connected to the one pair of signal lines in such a manner that when one of the plurality of word lines is activated, a potential difference corresponding to a content stored in the memory cell connected to the activated word line appears between the one pair of signal lines. A sense amplifier has a differential amplifier connected to the one pair of signal lines to output a signal in accordance with the potential difference appearing between the one pair of signal lines, and a feedback circuit composed of a flipflop for amplifying the potential difference appearing between the one pair of signal lines.

8 Claims, 8 Drawing Sheets

1 MEMORY CELL

SENSE AMPLIFIER OF SEMICONDUCTOR MEMORY HAVING AN INCREASED READING SPEED

BACKGROUND OF THE INVENTION

1. Field of the Invention

The present invention relates to a semiconductor memory, and more specifically to a sense amplifier for a static random access memory (SRAM) including bipolar transistors.

2. Description of Related Art

In a semiconductor memory including not only a SRAM but also other types of semiconductor memory, it is required to elevate an integration density in order to obtain a large storage capacity, and therefore, it is an ordinary practice that a memory cell is composed of a MOS transistor (metal oxide semiconductor field effect transistor). However, the MOS transistor is lower in sensitivity than a bipolar transistor, and larger in variation of performance than the bipolar transistor. Therefore, if a sense amplifier is constituted of MOS transistors, an access speed disadvantageously becomes low. Therefore, in the SRAM specially required to have a high access speed, a so called BiCMOS structure is adopted in which each memory cell is composed of MOS transistors but the sense amplifier is constituted of bipolar transistors, in order to make the integration density and the high speed access compatible to each other.

Referring to FIG. 1, them is shown a circuit diagram illustrating a portion of a typical conventional BiCMOS SRAM, which is disclosed by, for example, 1993 IEEE International Solid-State Circuits Conference, "Digest of Technical Papers", Pages 246–247. An actual SRAM includes a number of memory cells, a number of word lines, a number of digit line pairs, a number of sense amplifiers, all of which am formed on a single semiconductor substrate, but in FIG. 1, only one memory cell, one word line, one digit line pair, and one sense amplifier are shown for simplification of the drawing. In addition, various peripheral circuits including a decoder circuit, a write circuit, a timing generator, etc., all of which are also formed on the single semiconductor substrate, are omitted for simplification of the drawing.

In FIG. 1, Reference Numeral 1 designates the memory cell, which is selected by a word line WL and a digit selection signal Y. When the word line WL is selected, the memory cell 1 is connected to a pair of complementary digit lines D and DB, and when the digit selection signal Y is selected (or activated), the digit lines D and DB are connected through a Y switch 2 to a pair of complementary bus lines B and BA, respectively. Here, the word line WL and the digit selection signal Y are selected by a decoder (not shown) on the basis of an input address signal (not shown), but explanation of a selection operation of the decoder will be omitted for simplification of the description and since it is well known to persons skilled in the art. In addition, the pair of bus lines B and BA are connected to other digit line pairs (not shown) through other Y switches (not shown), so that only one digit line pair selected by the decoder is connected to the bus line pair B and BA.

As shown in FIG. 1, the pair of bus lines B and BA are connected to a base of a pair of bipolar transistors Q100 and Q101, respectively, so that signals on the bus lines B and BA are transferred to a sense amplifier 800-1 through a pair of complementary input signal lines E and EA connected to an emitter of these bipolar transistors Q100 and Q101, respectively. The sense amplifier 800-1 is one of a group of sense amplifiers 800-1, 800-2, • • • , 800-i which are of the same number as that of the bus signal line pairs provided in the SRAM. A pair of complementary output signal lines C and CA provided in common to the group of sense amplifiers, are connected to a converting circuit 810. Similarly to the sense amplifiers 800-1, the other sense amplifiers 800-2, • • • , 800-i of the group of sense amplifiers are connected to a number of memory cells (not shown) through other digit line pairs, bus line pairs and input signal line pairs (not shown), but these are not shown for simplification of the drawings. In addition, the pair of output signal lines C and CA are in common to all the sense amplifiers of the sense amplifier group, and therefore, if one sense amplifier is activated, the other sense amplifiers must be maintained in an inactivated condition. In other words, if a sense amplifier activation signal A1 is outputted from the not-shown selector, the sense amplifier 800-1 is activated, but the other sense amplifiers are maintained in the inactivated condition, so that the other sense amplifiers are inhibited from outputting to the pair of output signal lines C and CA. A converting circuit 810 converts a current flowing through the pair of output signal lines C and CA, into a voltage value, which is outputted to a latch circuit 820. The latch circuit 820 latches the voltage outputted from the converting circuit 810, in response to a latch activation signal A2, and outputs the latch voltage signal to an output terminal Dout.

Now, a reading operation of the above mentioned SRAM will be explained while paying attention to the sense amplifier 800-1.

If a potential on the pair of bus lines B and BA has been fixed in response to selection made by the not-shown decoder, the sense amplifier activation signal A1 is brought to a high level, so that MOS transistors M100, M101 and M102 are turned on to allow a constant current to flow through these transistors. Thus, the potential of the pair of input signal lines E and EA become a potential on the pair of bus lines B and BA level-shifted by a P-N junction forward direction voltage drop (Vf) of the bipolar transistors Q100 and Q101, respectively. Therefore, by action of bipolar transistors Q102 and Q103 constituting a differential amplifier, a current, which is in accordance with a voltage applied to a base of the bipolar transistor, namely, in accordance with the potential on a corresponding input signal line E and EA, flows through a corresponding output signal line C and CA.

As mentioned above, the potential on the pair of input signal lines E and EA are a potential on the pair of bus lines B and BA level-shifted by Vf, respectively, and therefor, a potential difference between the pair of input signal lines E and EA is the same as a potential difference between the pair of digit lines D and DB. Nevertheless, not only the memory cell 1 but also many not-shown memory cells are connected to the pair of digit lines D and DB, and therefore, a capacitive load of the pair of digit lines D and DB are considerably large. Accordingly, the potential difference between the pair of digit lines D and DB is extremely small. The bipolar transistors Q102 and Q103 differentially amplify this extremely small potential difference. But, since a bipolar transistor has a high sensitivity, a collector current sharply and widely changes in response to an extremely small change of the base potential. Therefore, the currents flowing through the output signal lines C and CA relatively quickly change in response to a slight potential difference between the pair of input signal lines E and EA respectively.

The currents flowing through the output signal lines C and CA, respectively, flow through resistors R100 and R101 together with constant currents of constant current sources I100 and I101 in the converting circuit 810, respectively, so that a voltage dropped by the respective resistor appears on each of nodes V100 and V101. Assuming that a larger current flows through the output signal line C, a potential on the node V100 becomes lower than that on the node V101. These potentials on the nodes V100 and V101 are latched in the latch circuit 820 in response to the latch activation signal A2. Thus, data stored in the memory cell 1 is read out from the output terminal Dout.

As mentioned above, since the conventional semiconductor memory has the sense amplifiers constituted of the differential amplifier of bipolar transistors as mentioned above, it is possible to relatively quickly detect a slight difference between the pair of input signal lines E and EA. However, a recent increase of the memory storage capacity results in an increased number of memory cells connected to each pair of digit lines. This further reduces the potential difference between the pair of digit lines when the memory is read out, and the change speed of the potential becomes slower. Accordingly, even if a high sensitive sense amplifier is used, the increased integration density results in an increased reading time, and therefore, conflicts with a high speed access. Therefore, a semiconductor memory having a sense amplifier capable of reading at a further elevated speed is now demanded.

SUMMARY OF THE INVENTION

Accordingly, it is an object of the present invention to provide a semiconductor memory which has overcome the above mentioned defect of the conventional one.

Another object of the present invention is to provide a semiconductor memory having a sense amplifier capable of reading at a more elevated speed, by further quickly detecting the voltage difference between a pair of digit lines.

The above and other objects of the present invention are achieved in accordance with the present invention by a semiconductor memory at least including one pair of signal lines, a plurality of memory cells connected to the plurality of word lines, respectively, and also connected to the one pair of signal lines in such a manner that when one of the plurality of word lines is activated, a potential difference corresponding to a content stored in the memory cell connected to the activated word line appears between the one pair of signal lines, and a sense amplifier having a potential difference detecting means connected to the one pair of signal lines to output a signal in accordance with the potential difference appearing between the one pair of signal lines, and a feedback means for amplifying the potential difference appearing between the one pair of signal lines.

With the above mentioned arrangement, since the feedback means amplifies the potential difference appearing between the one pair of signal lines, the signal outputted from the potential difference detecting means has an extremely quick transition time, so that the time required for the reading can be shortened.

The above and other objects, features and advantages of the present invention will be apparent from the following description of preferred embodiments of the invention with reference to the accompanying drawings.

DESCRIPTION OF THE PREFERRED EMBODIMENTS

Figure 2:
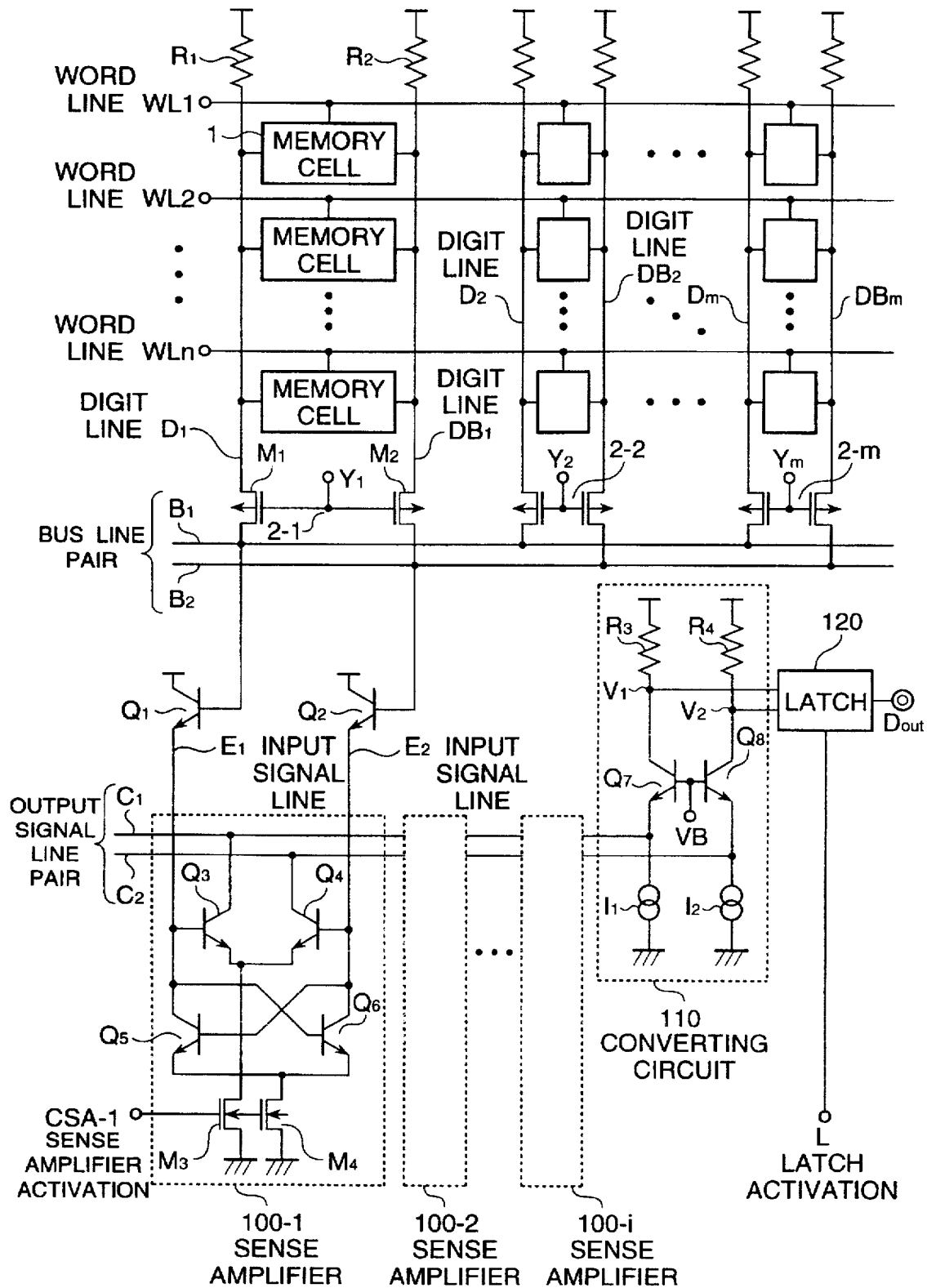
FIG. 2 is a circuit diagram illustrating a portion of a first embodiment of the semiconductor memory in accordance with the present invention.

Referring to FIG. 2, there is shown a circuit diagram of an essential part of a first embodiment of the semiconductor memory in accordance with the present invention, which includes "j" memory cells formed in the form of a matrix on a single semiconductor substrate (not show), where "j"= "m"×"n"×"i" (each of "m", "n" and "i" is natural number larger than 1). Since the present invention is characterized by a sense amplifier used when data is read out, FIG. 2 depicts only portions relating to the data reading operation, and the other portions including a writing circuit, an address decoder, a timing generator, for example, are omitted in FIG. 2 for simplification of the drawing. This is also applicable in the following description.

Figure 3:
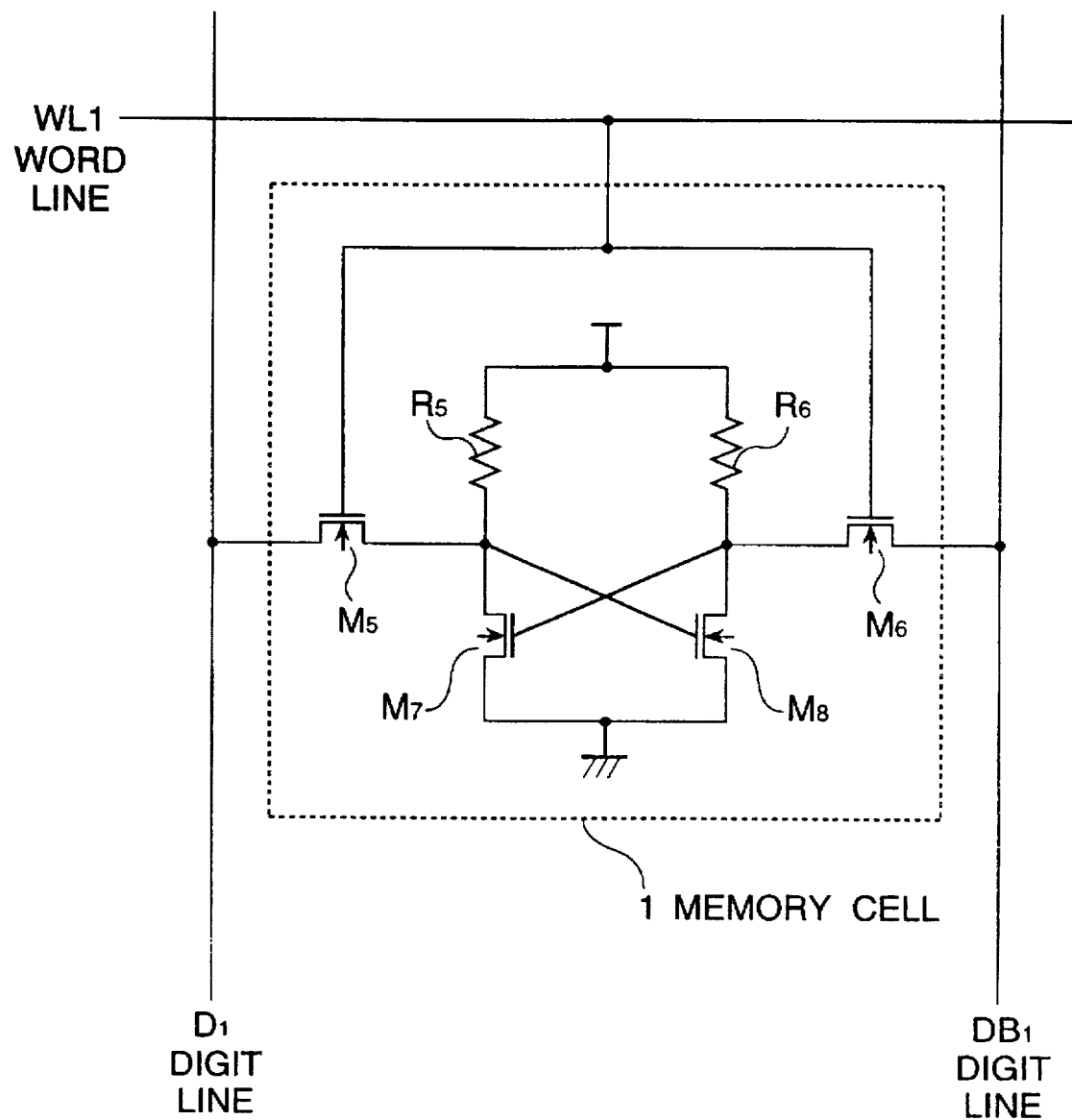
FIG. 3 is a circuit diagram illustrating a memory cell used in the semiconductor memory shown in FIG. 2.

Referring to FIG. 3, there is shown a circuit diagram illustrating a memory cell 1 used in the semiconductor memory shown in FIG. 2. But, it it to be understood that the other memory cells have the same construction as that of the memory cell 1. As shown in FIG. 3, the memory cell 1 includes a flipflop composed of a pair of load elements R5 and R6 and a pair of N-channel MOS transistors M7 and M8, and a pair of transfer gates consisting of N-channel MOS transistors M5 and M6, respectively, which are connected as shown. When a word line WL1 is selected and brought to a high level, the N-channel MOS transistors M5 and M6 are turned on, so that the flipflop constituting a storage unit is connected to a pair of complimentary digit lines D1 and DB1. With this, a content stored in the flipflop is read out to the pair of digit lines D1 and DB1, or alternatively, data on the pair of digit lines D1 and DE1 is written into the flipflop.

Returning to FIG. 2, the shown embodiment of the semiconductor memory includes "i" sense amplifiers 100-1 to 100-i for the purpose of reading the matrix of the "j" memory cells, and each of the sense amplifiers is arranged to read out a memory cell group consisting of "m"×"n" memory cells. However, of the "i" sense amplifiers 100-1 to 100-i, only the sense amplifier 100-1 is shown in FIG. 2. In addition, of "j" memory cell groups, one memory cell group consisting of "m"×"n" memory cells read out by the sense amplifier 100-1 is shown in FIG. 2.

As shown in FIG. 2, the memory cells allocated to the sense amplifier 100-1 are arranged in the form of a matrix having "m" columns and "n" rows, so that one memory cell is selected by "n" word lines WL1, WL2, • • •, WLn and "m" column switches 2-1, 2-2, • • •, 2-m, with the result that data stored in the memory cell is read out to a pair of complementary bus lines B1 and B2.

One of the "n" word lines WL1, WL2, • • •, WLn is selected and brought to a high level by a not-shown decoder for decoding a portion of an input address, and one of "m" column selecting signals Y1, Y2, • • •, Ym is selected and activated by another not-shown decoder for decoding another portion of an input address, so that a corresponding one column switch of the "m" column switches 2-1, 2—2, • • •, 2-m is put in a conductive condition.

A pair of bus lines B1 and B2 transfer the datum of the memory cell selected as mentioned above, to a base of bipolar transistors Q1 and Q2, respectively, and an emitter of these bipolar transistors Q1 and Q2 are connected through a pair of complimentary input signal lines E1 and E2 to the sense amplifier 100-1.

As shown in FIG. 2, the sense amplifier 100-1 includes a pair of bipolar transistors Q3 and Q4 connected to constitute a differential amplifier, a pair of bipolar transistors Q5 and Q6 connected in the form of a flipflop, and N-channel MOS transistors M3 and M4 each connected to constitute a current source. The bipolar transistors Q5 and Q6 connected in the form of a flipflop constitute a feedback circuit.

In brief, the input signal lines E1 and E2 are connected to a base of the bipolar transistors Q3 and Q4, respectively, which in turn have their collector connected to a pair of complimentary output signal lines C1 and C2, respectively, and their emitter connected in common to one end of the N-channel MOS transistors M3 having the other end connected to ground. The input signal lines E1 and E2 are also connected to a base of the bipolar transistors Q6 and Q5, respectively, which in turn have their emitter connected in common to one end of the N-channel MOS transistors M4 having the other end connected to ground. The base of each of the bipolar transistors Q6 and Q5 is cross-connected to a collector of the other transistor.

Thus, the MOS transistors M3 and M4 are controlled by a sense amplifier activation signal CSA-1, so that when the sense amplifier activation signal CSA-1 is brought to a high level, the MOS transistor M3 supplies an operating current of the differential amplifier composed of the bipolar transistors Q3 and Q4, and the MOS transistor M4 supplies an operating current of the flipflop composed of the bipolar transistors Q5 and Q6. Here, sense amplifier activation signals include sense amplifier activation signals CSA-1 to CSA-i corresponding to the "i" sense amplifiers 100-1 to 100-i, and only one of the sense amplifier activation signals CSA-1 to CSA-i is selected and activated to a high level by a not shown decoder for decoding a portion of the input address.

An output of the sense amplifier 100-1 is connected to the pair of output signal lines C1 and C2 in common to all the sense amplifiers, so that the output of the sense amplifier 100-1 is supplied through the output signal lines C1 and C2 to a convening circuit 110. This converting circuit 110 converts the current flowing through the output signal lines C1 and C2, to a voltage value, which is in turn supplied to a latch circuit 120. In response to a latch signal L, the latch circuit 120 latches the voltage signal outputted from the converting circuit 110, so that the value latched in the latch circuit 120 is outputted to an output terminal Dout as an output data.

Figure 4:
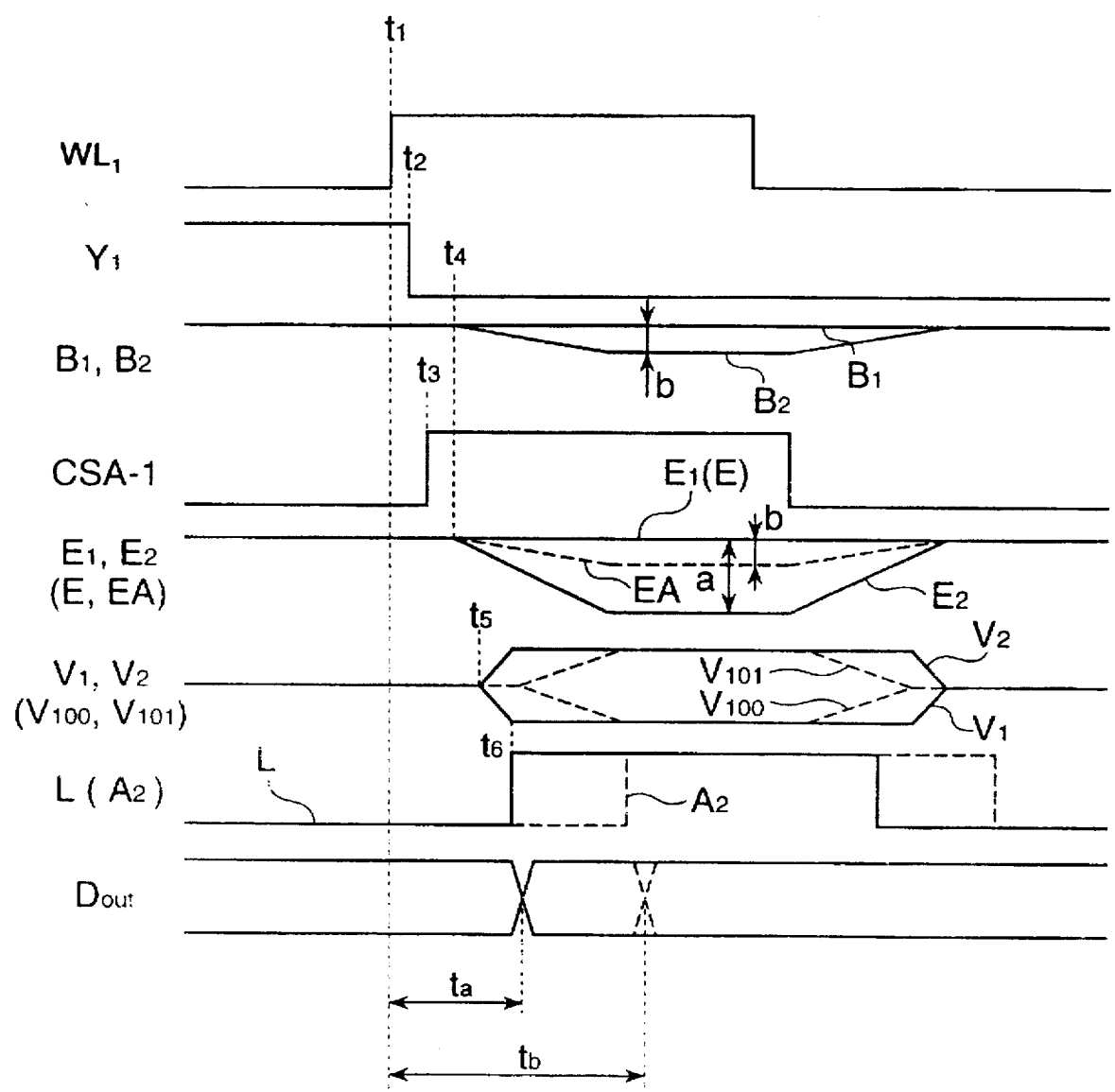
FIG. 4 is a timing chart illustrating an operation of the first embodiment of the semiconductor memory in accordance with the present invention shown in FIG. 2.

Now, operation of the first embodiment of the semiconductor memory is described in accordance with the present invention with reference to the timing chart of FIG. 4.

An input address is decoded by the not-shown decoder, so that the word line WL, the column selection signal Y and the sense amplifier activation signal CSA corresponding to the input address are activated. For example, FIG. 4 illustrates a situation in which the word line WL1, the column selection signal Y1 and the sense amplifier activation signal CSA-1 are activated by the not-shown decoder, and the following description is based on this situation. Although not limited, this embodiment uses a so-called pulse word type decoder configured to bring a Selected word line to the high level for only a predetermined period of time when an address is applied. Under the pulse word type, therefore, the potential of the selected word line is returned to the low level without exception after the predetermined time has elapsed, and the digit line pairs are precharged until the next reading operation, so that the next reading operation is performed at a high speed.

First, if the address is applied, the not-shown decoder decodes a portion of the applied address and brings the word line WL1 to the high level at a time t1. Thus, all the memory cells connected to the word line WL1 output the content stored therein to the associated pair of complimentary digit lines. At this time, the capability of the memory cell 1 for driving the pair of digit lines D1 and DB1 is very small, but on the other hand, since a number of memory cells ("n" memory cells) are connected to the pair of digit lines D1 and DB1 so that a load capacitance of the pair of digit lines D1 and DB1 is very large. Therefore, a potential difference occurring between the pair of digit lines D1 and DB1 is very small, and the change of the potential on these digit lines D1 and DB1 is very slow.

Later, the column selection signal Y1 is selected by the not-shown decoder and brought to the low level at a time t2, so that the column switch 2-1 is turned on. As a result, the pair of digit lines D1 and DB1 are connected to the pair of bus lines B1 and B2, respectively, so that the potential on the pair of bus lines B1 and B2 becomes equal to that on the pair of digit lines D1 and DB1, respectively, at a time t4. As mentioned above, since the potential difference spread between the pair of digit lines D1 and DB1 is very slow and very small, the potential difference spread between the pair of bus lines B1 and B2 is also very slow and very small.

Before the potential difference starts to occur between the pair of bus lines B1 and B2, the sense amplifier activation signal CSA-1 is brought to the high level at a time t3. Therefore, at the time t4 where the potential difference starts to occur between the pair of bus lines B1 and B2, the constant current has already begun to flow through each of the MOS transistors M3 and M4. Accordingly, a potential difference starts to occur and spread between the pair of input signal lines E1 and E2 at the time t4. Thus, if the potential difference occurs between the pair of input signal lines E1 and E2, a current depending upon the potential difference starts to flow through the bipolar transistors Q3 and Q4, and therefore, through the pair of output signal lines C1 and C2.

Figure 1:
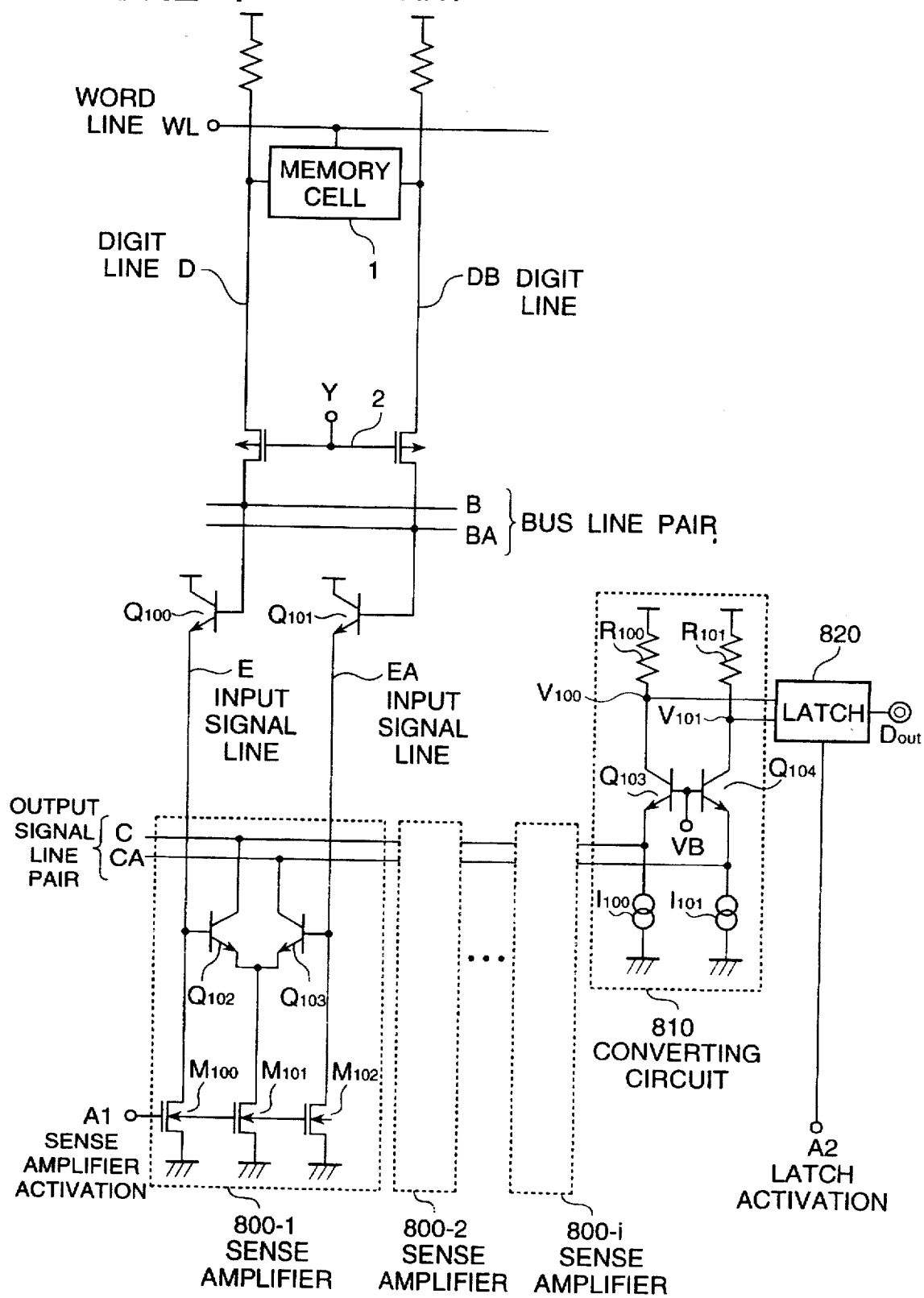
FIG. 1 is a circuit diagram illustrating a portion of a typical conventional BiCMOS SRAM.

Unlike the conventional example mentioned hereinbefore, this embodiment has the feedback circuit of the bipolar transistors Q5 and Q6 connected to the pair of output signal lines C1 and C2. Therefore, the potential difference occurring between the pair of input signal lines E1 and E2 is fed back through the bipolar transistors Q5 and Q6, so that a current flowing through a high potential side line of the pair of input signal lines E1 and E2 decreases, and a current flowing through a low potential side line of the pair of input signal lines E1 and E2 increases. With this action, the potential of the high potential side line of the pair of input signal lines E1 and E2 is caused to further elevate, and the potential of the low potential side line of the pair of input signal lines E1 and E2 is caused to further drop. Therefore, the potential difference spread between the pair of input signal lines E1 and E2 becomes larger and quicker than the potential difference spread between the pair of bus lines B1 and B2. In FIG. 4, the dotted line indicates the potential change on the pair of input signal lines E and EA in the conventional circuit shown in FIG. 1, and the solid line shows the potential change on the pair of input signal lines E1 and E2 in this embodiment. The potential difference "b" between the pair of input signal lines E and EA in the conventional circuit is the same as that between the pair of bus lines B and BA in the conventional circuit, but the potential difference "a" between the pair of input signal lines E1 and E2 in this embodiment is larger than the potential difference "b" between the pair of bus lines B1 and B2 in this embodiment, and spreads quicker than the potential difference "a" between the pair of bus lines B1 and B2.

As mentioned above, since the potential difference spread between the pair of input signal lines E1 and E2 is larger and quicker than the conventional example, the current corresponding to this potential difference spread flows quickly through the pair of output signal lines C1 and C2. This is transferred to the converting circuit 110. The respective currents flowing through the pair of output signal lines C1 and C2 flow together with currents of the constant current sources I1 and I2 of the converting circuit 110, respectively, through bipolar transistors Q7 and Q8 and resistors R3 and R4, respectively. A voltage dropped by these resistors R3 and R4 appears on nodes V1 and V2, respectively, at a time t5.

Incidentally, a predetermined reference voltage VB is applied to a base of each of the bipolar transistors Q7 and Q8. As mentioned above, since the current flows through the output signal lines C1 and C2 in a quick response to the potential difference spread between the pair of bus lines B1 and B2, a potential difference between the nodes V1 and V2 spreads quickly as compared with the conventional example. A latch signal L is generated at a time t6 where the potential difference between the nodes V1 and V2 reaches a magnitude which can be latched by the latch circuit 120, so, that an output data is latched in the latch circuit 120 and is outputted from the output terminal Dout. As shown in dotted line in FIG. 4, in the conventional example, since a long time was required until the potential difference between the nodes V100 and V101 reaches a magnitude which can be latched by the latch circuit 120, there was no other means than to delay the generation of the latch signal A2. Therefore, a long time is taken until the data is outputted from the output terminal Dout (tb). In this embodiment, the time required until the data is outputted from the output terminal Dout is shortened (ta).

An advantage of this embodiment was examined by simulation. When this embodiment is applied to a 1 Mbit SRAM, a time required from a word line selection to the data outputting in a memory reading operation is shortened by about 30%, as compared with a case in that the conventional example is applied. On the other hand, it was observed that the consumed electric power does not increase as compared with the conventional example.

Figure 5:
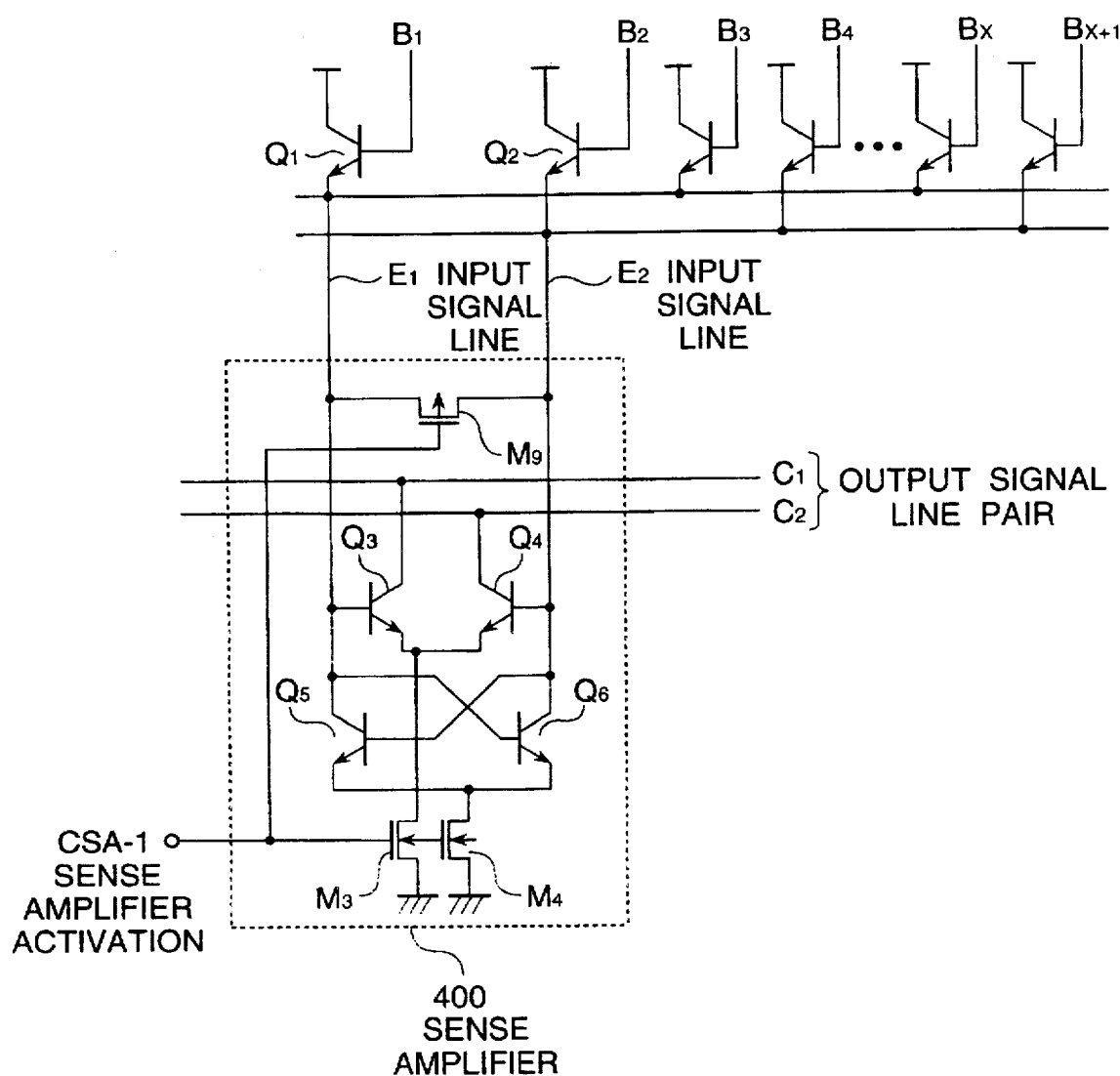
FIG. 5 is a circuit diagram illustrating a sense amplifier of a second embodiment of the semiconductor memory in accordance with the present invention.

Now, a second embodiment of the semiconductor memory in accordance with the present invention will be described with FIG. 5. In FIG. 5, elements similar to those shown in FIG. 2 are given the same Reference Numerals, and explanation thereof will be omitted.

This second embodiment of the semiconductor memory in accordance with the present invention is realized by substituting a sense amplifier 400 shown in FIG. 5 for the sense amplifier 100 of the semiconductor memory shown in FIG. 2.

As seen from comparison between FIGS. 2 and 5, the sense amplifier 400 includes a P-channel MOS transistor M9 connected between the pair of input signals lines E1 and E2 and controlled by the sense amplifier activation signal CSA-1. When the sense amplifier activation signal CSA-1 is at a low level, namely during a period in which a reading operation is not performed, the pair of input signals lines E1 and E2 are short-circuited.

In the sense amplifier 100 of the first embodiment, the column selection signal Y1 continues to be maintained at the low level even after the completion of the reading operation. Therefore, after the sense amplifier activation signal CSA-1 is returned to the low level, not only the pair of digit lines are precharged to the same potential by the resistors R1 and R2, but also, the pair of the input signal lines E1 and E2 are precharged to the same potential. However, since the MOS transistors M3 and M4 are off, the potential change of the input signal lines E1 and E2 is relatively slow, and therefore, a substantial time is required until the pair of the input signal lines E1 and E2 becomes the same potential. The second embodiment is configured to overcome this problem. Namely, in this second embodiment, the pair of the input signal lines E1 and E2 are short-circuited during a period other than the reading operation period, so that the pair of the input signal lines E1 and E2 are forcibly brought to the same potential. Therefore, the preparing period for a next reading can be shortened.

Incidentally, in the second embodiment shown in FIG. 5, the pair of the input signal lines E1 and E2 are not in a one-to-one relation to the bus line pair. Namely, the pair of the input signal lines E1 and E2 are connected to a plurality of pair of bus lines through a wired-OR. By connecting to a plurality of pair of bus lines to one pair of the input signal lines, it is possible to reduce the number of sense amplifiers. However, when a plurality of pair of bus lines are connected by a wired-OR, it is necessary to provide a means for dropping the potential of non-selected pairs of bus lines, so that a base current of a corresponding bipolar transistor is cut off. Accordingly, if for example a pair of bus lines B1 and B2 are to be selected, it is necessary to drop the potential of the other bus lines B3 to Bx+1.

Furthermore, the sense amplifier 400 shown in FIG. 5 and the wired-OR connection of the plurality of pairs of bus lines may be adopted independently of each other. However, if a plurality of pairs of bus lines are connected by the wired-OR, the number of transistors connected to the pair of input signal lines E1 and E2 increases, and therefore, the load capacitance correspondingly increases. Therefore, if the sense amplifier 400 shown in FIG. 5 is adopted together with the wired-OR connection of the plurality of pairs of bus lines, the advantage of the sense amplifier 400 can be effectively exerted.

Figure 6:
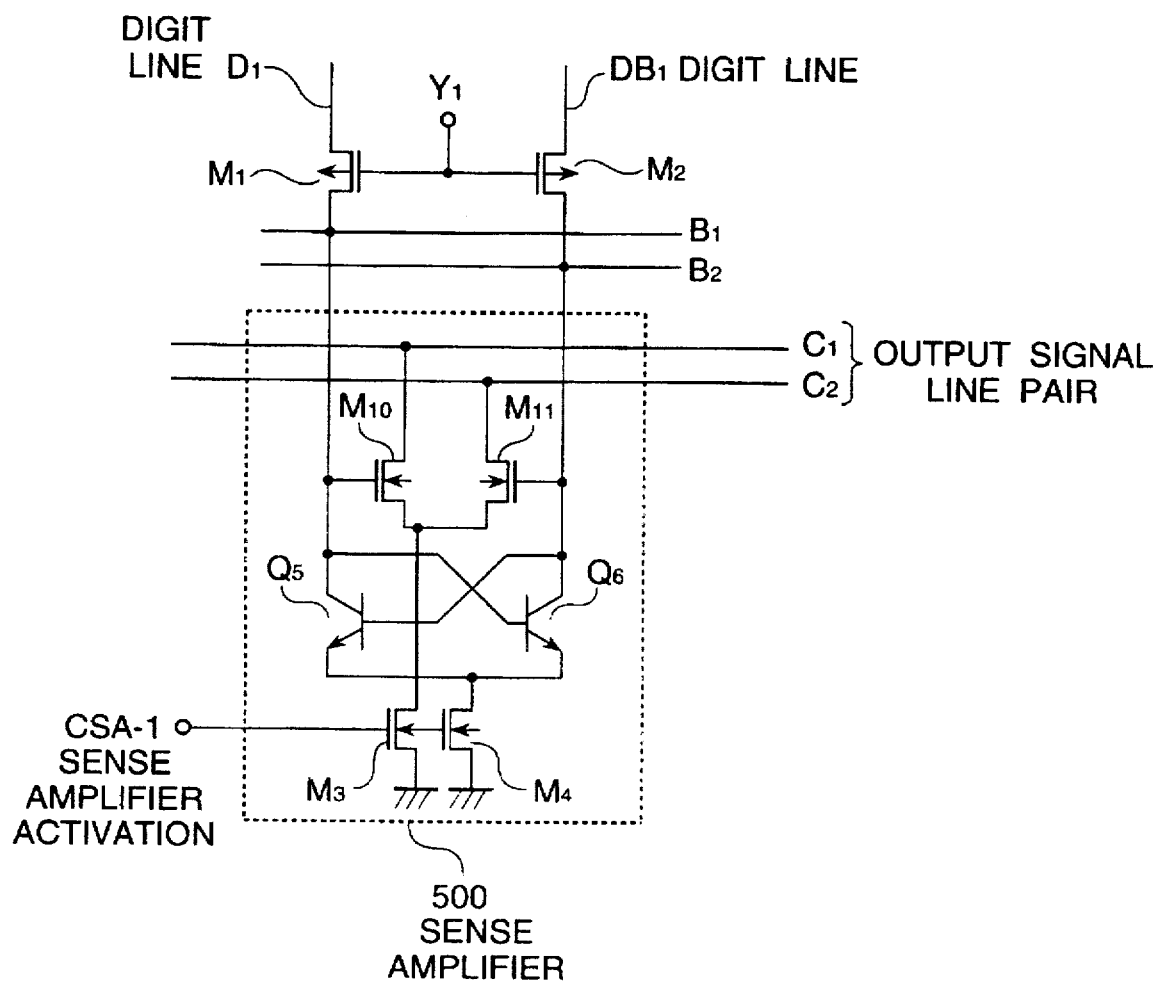
FIG. 6 is a circuit diagram illustrating a sense amplifier of a third embodiment of the semiconductor memory in accordance with the present invention.

Now, a third embodiment of the semiconductor memory in accordance with the present invention will be described with FIG. 6. In FIG. 6, elements similar to those shown in FIG. 2 are given the same Reference Numerals, and explanation thereof will be omitted.

This third embodiment of the semiconductor memory in accordance with the present invention is realized by substituting a sense amplifier 500 shown in FIG. 6 for the sense amplifier 100 of the semiconductor memory shown in FIG. 2, and by omitting the transistors Q1 and Q2 level-shifting the voltage of the bus lines B1 and B2 by Vf.

In the first embodiment, in order to ensure that the bipolar transistors Q3 and Q4 in the sense amplifier 100 does not operate in a saturated region, it is necessary to drop the potential of the input signal lines E1 and E2 by the transistors Q1 and Q2. In the third embodiment, however, since the differential amplifier in the sense amplifier is composed of MOS transistors M10 and M11, it is no longer necessary to drop the potential of the input signal lines E1 and E2, and therefore, the transistors Q1 and Q2 are omitted.

Accordingly, in the third embodiment, since four bipolar transistors can be omitted for each one sense amplifier, the necessary chip area can be reduced in comparison with the first embodiment.

On the other hand, since the differential amplifier is composed of MOS transistors, the differential amplifier has sensitivity lower than the bipolar differential amplifier. However, similarly to the first embodiment, the differential amplifier composed of MOS transistors is fed back by the bipolar transistors Q5 and Q6, and furthermore, the digit lines D1 and DB1 are connected to the sense amplifier through only the Y switch (M1 and M2), so that the potential difference between the input signal lines is increased by the voltage drops of the resistors R1 and R2. As a result, the reading speed is considerably higher than the conventional example.

Figure 7:
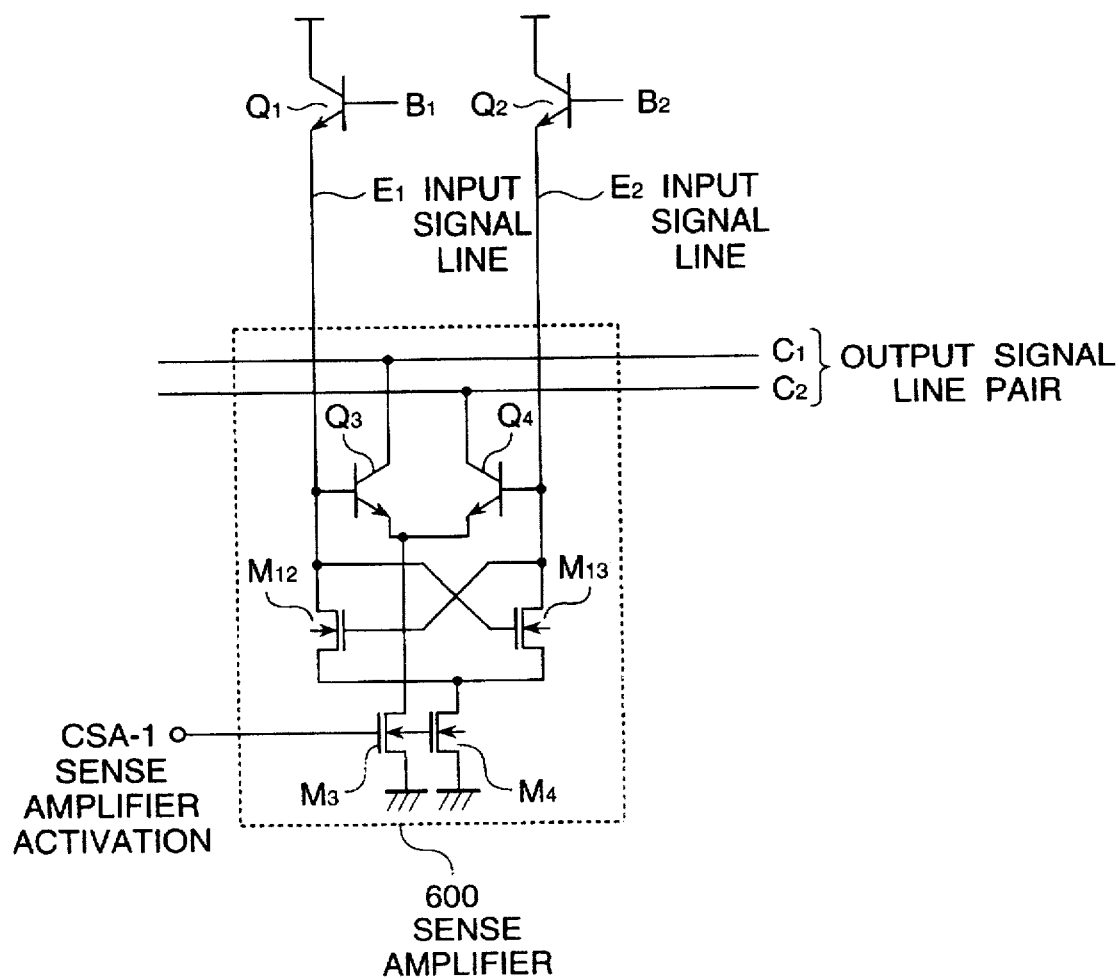
FIG. 7 is a circuit diagram illustrating a sense amplifier of a fourth embodiment of the semiconductor memory in accordance with the present invention.

Now, a fourth embodiment of the semiconductor memory in accordance with the present invention will be described with FIG. 7. In FIG. 7, elements similar to those shown in FIG. 2 are given the same Reference Numerals, and explanation thereof will be omitted.

This fourth embodiment of the semiconductor memory in accordance with the present invention is realized by substituting a sense amplifier 600 shown in FIG. 7 for the sense amplifier 100 of the semiconductor memory shown in FIG. 2.

As seen from comparison between FIGS. 2 and 7, the feedback bipolar transistors Q5 and Q6 in the sense amplifier 100 of the first embodiment 100 are replaced by N-channel MOS transistors M12 and M13, respectively. Namely, the fourth embodiment is characterized in that a portion added to the conventional example by the first embodiment is realized by the MOS transistors. Therefore, the high speed reading given by the feedback circuit can be enjoyed without a substantial increase of the chip area compared with the conventional example.

In the fourth embodiment, since the feedback circuit is composed of MOS transistors, the effect of the feedback circuit of quickly amplifying the potential difference between the input signal lines E1 and E2 is smaller than that obtained in the first embodiment, and therefore, the effect of quickening the reading speed is small. Nevertheless, the reading speed of the fourth embodiment is still considerably higher than that of the conventional example.

Figure 8:
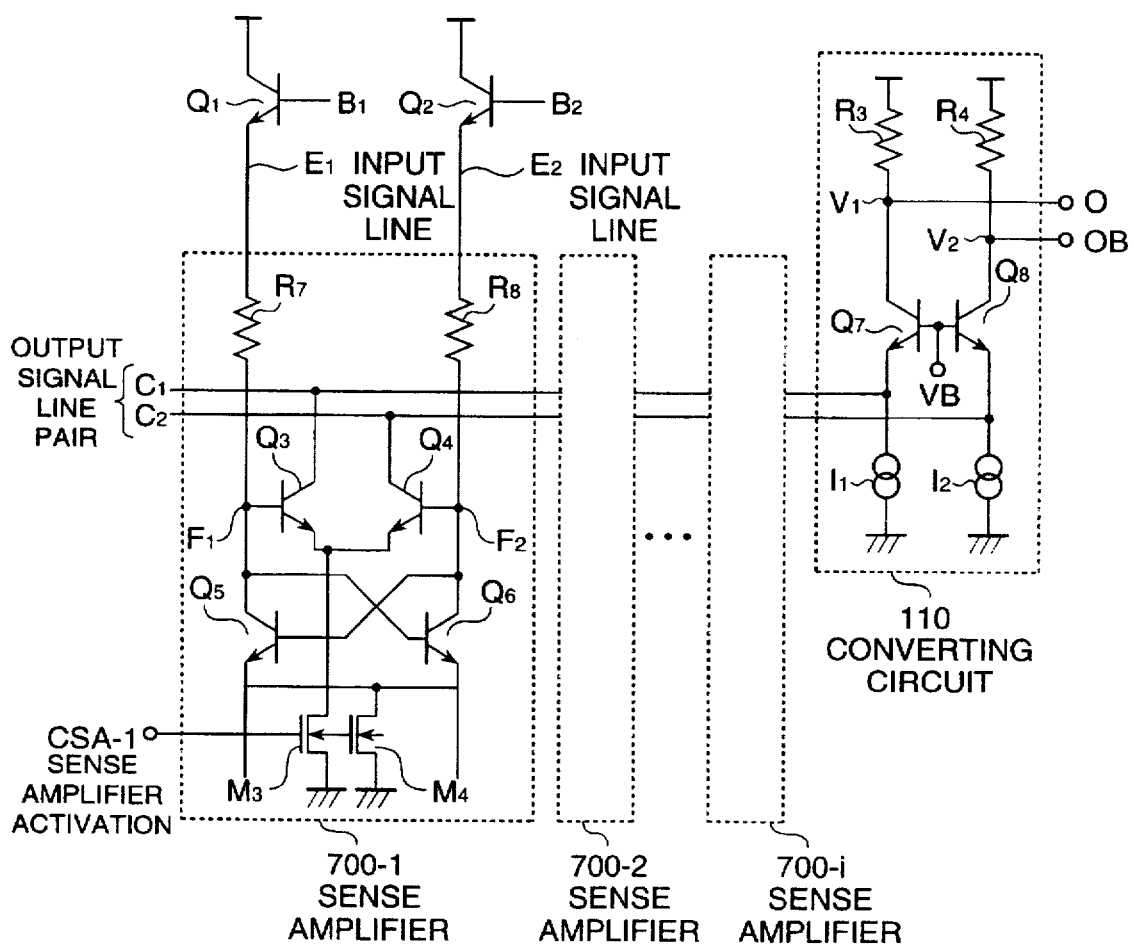
FIG. 8 is a circuit diagram illustrating a sense amplifier of a fifth embodiment of the semiconductor memory in accordance with the present invention.

Now, a fifth embodiment of the semiconductor memory in accordance with the present invention will be described with FIG. 8. In FIG. 8, elements similar to those shown in FIG. 2 are given the same Reference Numerals, and explanation thereof will be omitted.

This fifth embodiment of the semiconductor memory in accordance with the present invention is realized by substituting a sense amplifier 700 shown in FIG. 8 for the sense amplifier 100 of the semiconductor memory shown in FIG. 2, and by omitting the latch circuit 120. Of course, since the latch circuit 120 is omitted, it is no longer necessary to generate the latch signal L.

As seen from FIG. 8, the sense amplifier 700 is characterized in that a resistor R7 is connected between the emitter of the bipolar transistor Q1 and a node F1 (the base of the bipolar transistor Q3), and a resistor R8 is connected between the emitter of the bipolar transistor Q2 and a node F2 (the base of the bipolar transistor Q4). Therefore, if, by action of the feedback circuit, a current flowing through a high potential side line of the pair of input signal lines E1 and E2 decreases, and a current flowing through a low potential side line of the pair of input signal lines E1 and E2 increases, a potential difference between the node F1 and F2 is further increased by a voltage drop of the resistors R7 and R8. As a result, one of the bipolar transistors Q5 and Q6 in the feedback circuit is turned on, and the other is turned off. This condition is just like a condition that data were written into a memory cell. Once this condition is realized, this condition does not change during a high level period of the sense amplifier activation signal CSA-1, even if the level change occurs on the pair of bus lines B1 and B2 having only a small potential difference. Accordingly, even if the word line WL1 is returned to the low level so as to start the precharging of the digit line pair, the output of the sense amplifier 700-1 does not change. Thus, by maintaining the high level of the sense amplifier activation signal CSA-1 during only a data holding period required by a next stage circuit, the output of the convening circuit 110 is unchanged. Namely, the latch circuit becomes unnecessary.

Thus, the fifth embodiment has not only a first advantage that the reading operation is speeded up by the feedback circuit, but also a second advantage that the latch circuit becomes unnecessary.

In addition, if the fifth embodiment is so modified that, similarly to the second embodiment, there is added a transistor for short-circuiting between the pair of input signal lines E1 and E2 or between the nodes F1 and F2, during a low level period of the sense amplifier activation signal CSA-1, it is possible to quickly clear the condition of the bipolar transistors Q5 and Q6 which had been fixed as mentioned above, so that a preparing period for the next reading operation can be shortened.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory comprising at least one pair of signal lines which are complementary to each other, a plurality of memory cells connected to a plurality of word lines, respectively, and also connected to said one pair of signal lines in such a manner that when one of said plurality of word lines is activated, a potential difference corresponding to a content stored in the memory cell connected to the activated word line appears between said one pair of signal lines, and a sense amplifier having a differential amplifier connected to receive said one pair of signal lines to output a signal in accordance with the potential difference appearing between said one pair of signal lines, and a flipflop for amplifying said potential difference appearing between said one pair of signal lines, wherein said sense amplifier includes an operating current supplying means for supplying an operating current to said differential amplifier and said flipflop in synchronism with a level change of any one of said plurality of word lines, and wherein said sense amplifier further includes a means for short-circuiting said one pair of complementary signal lines when said operating current supplying means does not supply said operating current to said differential amplifier and said flipflop.

2. A semiconductor memory comprising at least one pair of signal lines which are complementary to each other, a plurality of memory cells connected to a plurality of word lines, respectively, and also connected to said one pair of signal lines in such a manner that when one of said plurality of word lines is activated, a potential difference corresponding to a content stored in the memory cell connected to the activated word line appears between said one pair of signal lines, and a sense amplifier having a differential amplifier connected to receive said one pair of signal lines to output a signal in accordance with the potential difference appearing between said one pair of signal lines, and a flipflop for amplifying said potential difference appearing between said one pair of signal lines, wherein each of said differential amplifier and said flipflop is formed of bipolar transistors.

3. A semiconductor memory comprising at least one pair of signal lines which are complementary to each other, a plurality of memory cells connected to a plurality of word lines, respectively, and also connected to said one pair of signal lines in such a manner that when one of said plurality of word lines is activated, a potential difference corresponding to a content stored in the memory cell connected to the activated word line appears between said one pair of signal lines, and a sense amplifier having a differential amplifier connected to receive said one pair of signal lines to output a signal in accordance with the potential difference appearing between said one pair of signal lines, and a flipflop for amplifying said potential difference appearing between said one pair of signal lines, wherein one of said differential amplifier and said flipflop is formed of bipolar transistors, but the other of said differential amplifiers and said flipflop is formed of MOS transistors.

4. A semiconductor memory at least including one pair of complementary digit lines, a plurality of word lines, a plurality of SRAM memory cells arranged at intersections between said one pair of digit lines and said plurality of word lines, respectively, and also connected to said one pair of signal lines in such a manner that when one of said plurality of word lines is activated, a potential difference corresponding to a content stored in the memory cell connected to the activated word line appears between said one pair of signal lines, first and second bipolar transistors having an emitter connected to each other, means for supplying a signal corresponding to potentials on said one pair of complementary digit lines, to a base of said first and second bipolar transistor, third and fourth bipolar transistors having a collector connected to a base of said first and second bipolar transistors, respectively, and an emitter connected to each other, a base of said third bipolar transistor being connected to the collector of said fourth bipolar transistor, and a base of said fourth bipolar transistor being connected to the collector of said third bipolar transistor, and means for detecting a difference between a collector current of said first bipolar transistor and a collector current of said second bipolar transistor, so as to convert the detected current difference into a voltage.

5. A semiconductor memory claimed in claim 4, further including an operating current supplying means for supplying an operating current to the common-connected emitters of said first and second bipolar transistors and the common-connected emitters of said third and fourth bipolar transistors in synchronism with a level change of anyone of said plurality of word lines, and a means for short-circuiting said base of said first and second bipolar transistors.

6. A semiconductor memory at least including one pair of complementary digit lines, a plurality of word lines, a plurality of SRAM memory cells arranged at intersections between said one pair of digit lines and said plurality of word lines, respectively, and also connected to said one pair of signal lines in such a manner that when one of said plurality of word lines is activated, a potential difference corresponding to a content stored in the memory cell connected to the activated word line appears between said one pair of signal lines, first and second MOS transistors having a source connected to each other, means for supplying a signal corresponding to potentials on said one pair of complementary digit lines, to a gate of said first and second MOS transistors, first and second bipolar transistors having a collector connected to a gate of said first and second MOS transistors, respectively, and an emitter connected to each other, a base of said first bipolar transistor being connected to the collector of said second bipolar transistor, and a base of said second bipolar transistor being connected to the collector of said first bipolar transistor, and means for detecting a difference between a drain current of said first MOS transistor and a drain current of said second MOS transistor, so as to convert the detected current difference into a voltage.

7. A semiconductor memory at least including one pair of complementary digit lines, a plurality of word lines, a plurality of SRAM memory cells arranged at intersections between said one pair of digit lines and said plurality of word lines, respectively, and also connected to said one pair of signal lines in such a manner that when one of said plurality of word lines is activated, a potential difference corresponding to a content stored in the memory cell connected to the activated word line appears between said one pair of signal lines, first and second bipolar transistors having an emitter connected to each other, means for supplying a signal corresponding to potentials on said one pair of complementary digit lines, to a base of said first and second bipolar transistor, first and second MOS transistors having a drain connected to a base of said first and second bipolar transistors, respectively, and a source connected to each other, a gate of said first MOS transistor being connected to the drain of said second MOS transistor, and a gate of said second MOS transistor being connected to the drain of said first MOS transistor, and means for detecting a difference between a collector current of said first bipolar transistor and a collector current of said second bipolar transistor, so as to convert the detected current difference into a voltage.

8. A semiconductor memory at least including one pair of complementary digit lines, a plurality of word lines, a plurality of SRAM memory cells arranged at intersections between said one pair of digit lines and said plurality of word lines, respectively, and also connected to said one pair of signal lines in such a manner that when one of said plurality of word lines is activated, a potential difference corresponding to a content stored in the memory cell connected to the activated word line appears between said one pair of signal lines, means for supplying a signal corresponding to potentials on said one pair of complementary digit lines, one end of first and second resistors, first and second bipolar transistors having a base connected to the other end of said first and second resistors, and an emitter connected to each other, third and fourth transistors having a collector connected to an emitter of said first and second bipolar transistors, respectively, and an emitter connected to each other, a base of said third bipolar transistor being connected to the collector of said fourth bipolar transistor, and a base of said fourth bipolar transistor being connected to the collector of said third bipolar transistor, and means for detecting a difference between a collector current of said first bipolar transistor and a collector current of said second bipolar transistor, so as to convert the detected current difference into a voltage.

* * * * *